United States Patent
Murphy et al.

(10) Patent No.: US 9,742,353 B2
(45) Date of Patent: Aug. 22, 2017

(54) CMOS VCO WITH IMPLICIT COMMON-MODE RESONANCE

(71) Applicant: BROADCOM CORPORATION, Irvine, CA (US)

(72) Inventors: David Patrick Murphy, Costa Mesa, CA (US); Hooman Darabi, Laguna Niguel, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/822,809

(22) Filed: Aug. 10, 2015

(65) Prior Publication Data

US 2016/0373058 A1 Dec. 22, 2016

Related U.S. Application Data

(60) Provisional application No. 62/183,116, filed on Jun. 22, 2015.

(51) Int. Cl.
*H03K 3/282* (2006.01)
*H03B 5/12* (2006.01)
*H04B 1/40* (2015.01)

(52) U.S. Cl.
CPC ......... *H03B 5/1284* (2013.01); *H03B 5/1212* (2013.01); *H03B 5/1228* (2013.01); *H03B 5/1265* (2013.01); *H03B 5/1271* (2013.01); *H03B 5/1278* (2013.01); *H03B 5/1296* (2013.01); *H03B 2200/009* (2013.01); *H04B 1/40* (2013.01)

(58) Field of Classification Search
CPC .. H03B 5/1284; H03B 5/1228; H03B 5/1271; H03B 5/1212; H03B 5/1296; H03B 2200/009; H03B 5/1278; H03B 5/1265; H04B 1/40
USPC ................................ 331/117 R, 117 FE, 167
See application file for complete search history.

(56) References Cited

U.S. PATENT DOCUMENTS

| | | | | |
|---|---|---|---|---|
| 7,116,183 B2* | 10/2006 | Wu | ........................... | H03B 5/04 331/117 FE |
| 7,602,260 B1* | 10/2009 | Atesoglu | ................ | H03B 27/00 331/186 |
| 8,212,625 B2* | 7/2012 | Lee | ...................... | H03B 5/1228 331/117 FE |
| 8,264,293 B2* | 9/2012 | Yun | ...................... | H03B 5/1225 331/117 FE |

(Continued)

*Primary Examiner* — Richard Tan
(74) *Attorney, Agent, or Firm* — McDermott Will & Emery LLP

(57) ABSTRACT

A circuit for an oscillator with common-mode resonance includes a first oscillator circuit and a second oscillator circuit coupled to the first oscillator circuit. Each of the first oscillator circuit or the second oscillator circuit includes a tank circuit, a cross-coupled transistor pair, and one or more capacitors. The tank circuit is formed by coupling a first inductor with a pair of first capacitors. The cross-coupled transistor pair is coupled to the tank circuit, and one or more second capacitors are coupled to the tank circuit and the cross-coupled transistor pair. Each of the first oscillator circuit or the second oscillator circuit allows tuning of a respective common mode (CM) resonance frequency ($F_{CM}$) to be at twice a respective differential resonance frequency ($F_D$).

20 Claims, 12 Drawing Sheets

(56) References Cited

U.S. PATENT DOCUMENTS

| | | | | |
|---|---|---|---|---|
| 8,717,112 B2* | 5/2014 | Chang | ............... | H03B 5/1228 |
| | | | | 331/117 FE |
| 8,779,865 B2* | 7/2014 | Ainspan | ............... | H03L 7/099 |
| | | | | 331/117 FE |
| 8,841,975 B2* | 9/2014 | Nakamura | ............... | H03L 7/02 |
| | | | | 331/108 A |
| 2004/0066241 A1* | 4/2004 | Gierkink | ............... | H03B 27/00 |
| | | | | 331/46 |
| 2007/0247237 A1* | 10/2007 | Mohammadi | ........ | H03B 5/1228 |
| | | | | 331/36 C |
| 2008/0309435 A1* | 12/2008 | Wu | ............... | H03B 5/18 |
| | | | | 333/204 |
| 2013/0135057 A1* | 5/2013 | Roithmeier | ......... | H03B 5/1284 |
| | | | | 331/117 FE |
| 2014/0091870 A1* | 4/2014 | Morris | ............... | H03K 3/0231 |
| | | | | 331/111 |

* cited by examiner

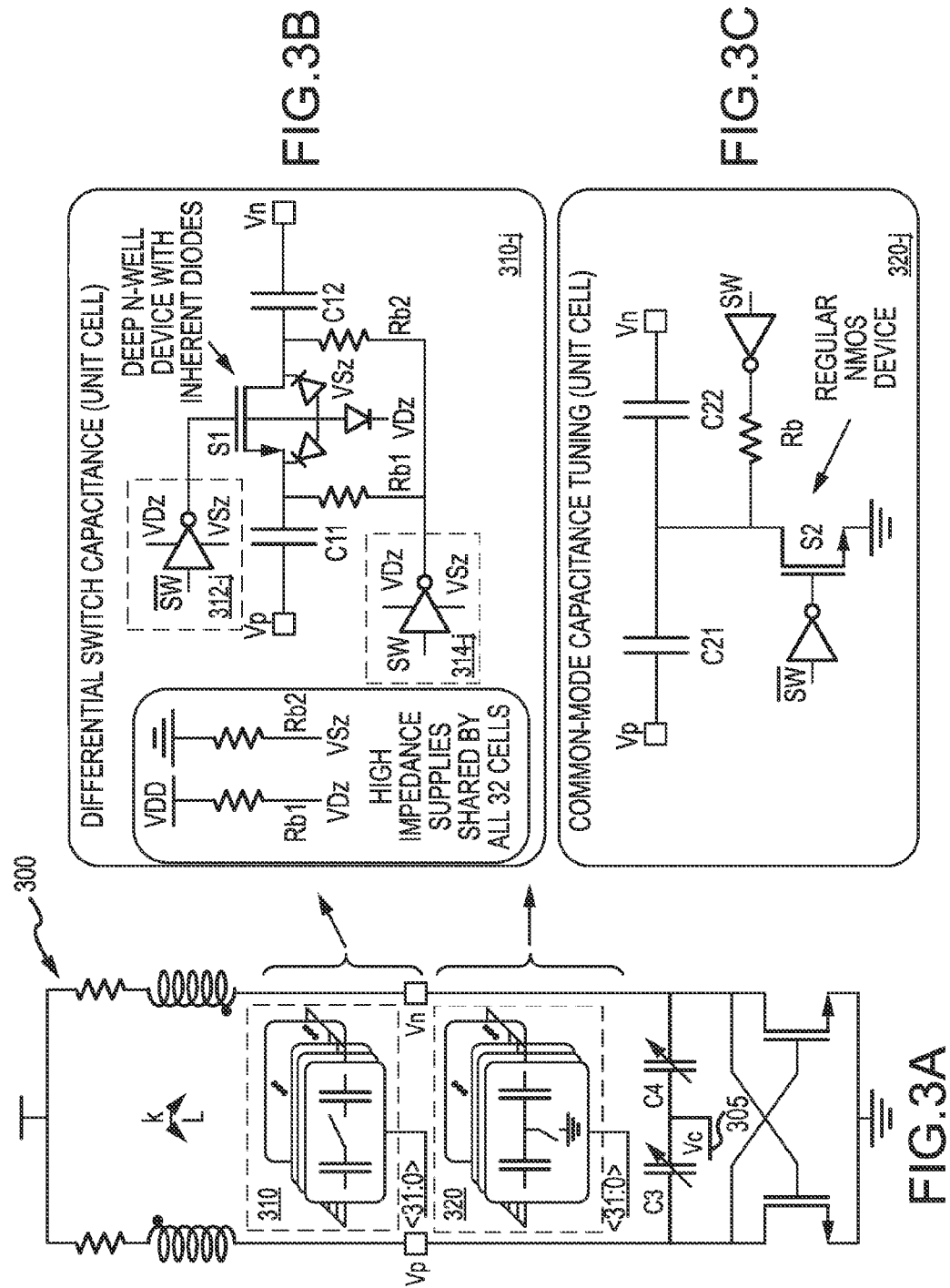

CMOS VCO WITH IMPLICIT COMMON-MODE RESONANCE

CROSS-REFERENCE TO RELATED APPLICATIONS

This application claims the benefit of priority under 35 U.S.C. §119 from U.S. Provisional Patent Application 62/183,116 filed Jun. 22, 2015, which is incorporated herein by reference in its entirety.

TECHNICAL FIELD

The present description relates generally to communication systems, and more particularly, but not exclusively, to a CMOS voltage-controlled oscillator (VCO) with implicit common-mode resonance.

BACKGROUND

Voltage controlled oscillators (VCOs) are the integral part of many communication systems, which use mixers to up-convert or down-convert signals. Mixers may up/down convert signals by employing local oscillators (LOs) to generate LO signals at a corresponding carrier frequency. Many LOs may use one or more oscillators (e.g., VCOs such as CMOS VCOs) to generate the LO signals. CMOS VCO performance metrics have not improved significantly over the last decade. An existing work that reported a VCO Figure of Merit (FOM) introduced a second resonant tank at a source of the differential pair, where the second resonant tank was tuned to twice the LO frequency ($F_{LO}$).

The additional tank circuit used in the existing work may provide a high common-mode impedance at the frequency of $2 \times F_{LO}$. The high common-mode impedance may prevent the differential pair transistors from conducting in the triode region and, so, can prevent the degradation of the oscillator's quality factor (Q). As a consequence the employed topology can achieve an oscillator noise factor (F) of close to 2, which is near the fundamental limit of a cross-coupled LC CMOS oscillator. A drawback of this solution is the additional area and the routing complexity demanded by an extra inductor of the additional tank circuit.

BRIEF DESCRIPTION OF THE DRAWINGS

Certain features of the subject technology are set forth in the appended claims. However, for purpose of explanation, several embodiments of the subject technology are set forth in the following figures.

FIGS. 3A through 3C illustrate examples of implementation of differential and CM capacitors of a differential inductor oscillator with CM resonance in accordance with one or more implementations.

DETAILED DESCRIPTION

Figure 1A:
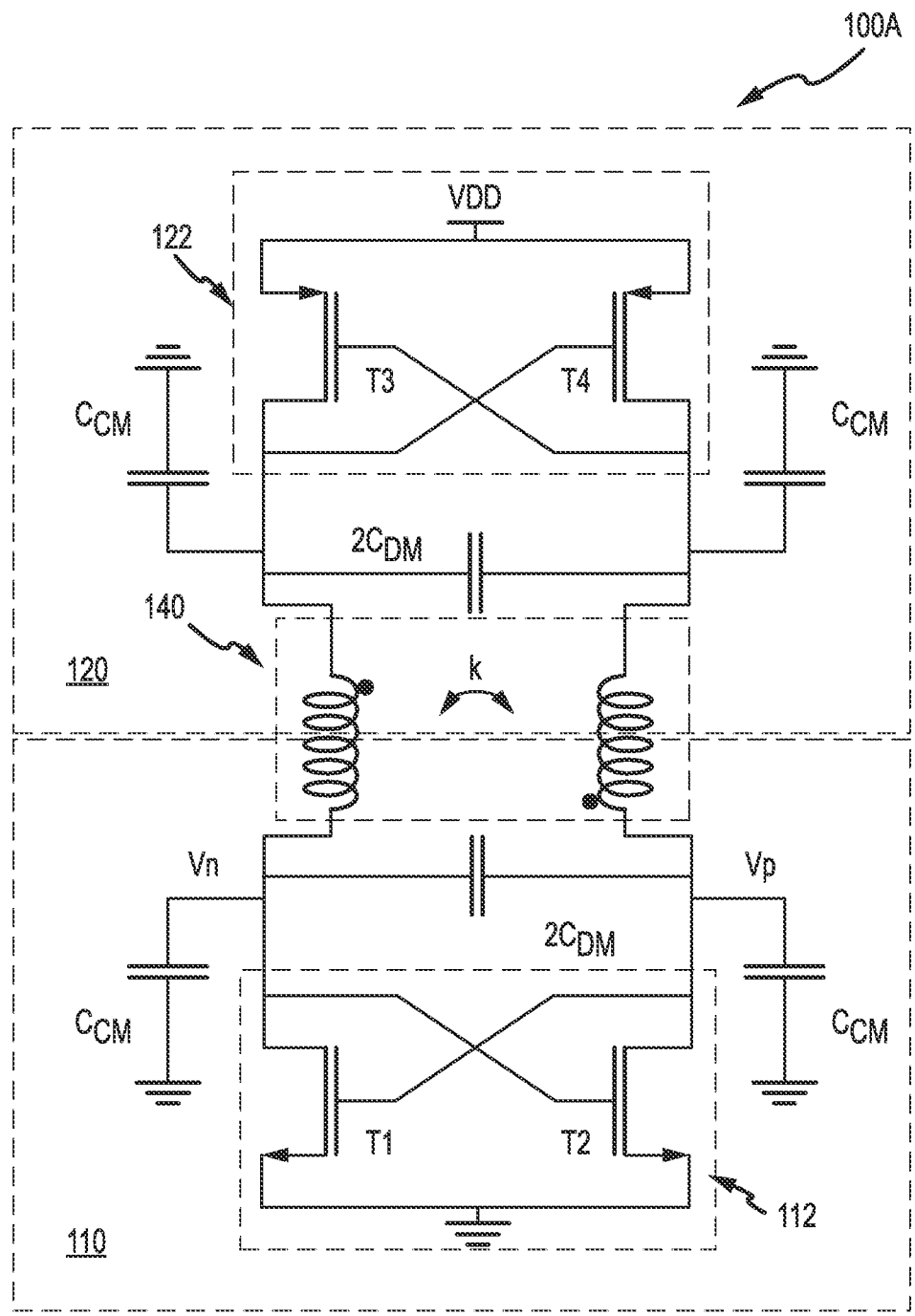
FIGS. 1A through 1D illustrate examples of a CMOS oscillator with common-mode (CM) resonance and a single differential-inductor oscillator, and examples of corresponding differential and CM excitation equivalent circuits of the same oscillator in accordance with one or more implementations.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

The subject technology is directed to a CMOS oscillator (e.g., a voltage-controlled oscillator (VCO)) with a common mode (CM) resonance at a CM frequency ($F_{CM}$) that can be tuned to be at twice the differential mode resonance frequency ($F_D$), which can result in a near ideal oscillator noise factor. The subject technology combines two single differential-inductor oscillators to attain advantageous features, which includes a lower output voltage swing that allows use of thin oxide devices (e.g., transistors such as CMOS transistors), that can be implemented with small channel length with higher unity gain frequency. It is understood that the use of thick oxide devices can adversely affect the operation frequency of the oscillator by limiting the maximum quality factor of the oscillator's tank circuit and/or limiting the negative conductance per unit capacitance of the differential pair (e.g., 112 or 122).

By differential inductor, we refer to a 3-terminal network composed of two coupled inductors with an arbitrary coupling factor (k) between the coupled inductors. In the limiting case of k=0, the differential inductor is substantially the same as two isolated inductors. The use of a single differential-inductor oscillator advantageously saves a second inductor typically used to minimize the phase noise, which results in a substantial saving in chip area and cost.

FIGS. 1A through 1D illustrate examples of a CMOS oscillator 100A with common-mode (CM) resonance, a single differential-inductor oscillator, and examples of corresponding differential and CM excitation equivalent circuits 100C and 100D of the same oscillator in accordance with one or more implementations of the subject technology. The CMOS oscillator 100A is formed by coupling a first oscillator 110 to a second oscillator 120. Each of the first and the second oscillators 110 and 120 are single differential-inductor oscillators, an example of which is the shown in FIG. 1B and is analyzed in more details herein. The first and the second oscillators 110 and 120 have similar structures except for the type of the devices (e.g., transistors) used in their active portions formed by cross-coupled transistor pair 112 and 122. The cross-coupled transistor pair 112 of the first oscillator 110 uses NMOS devices T1 and T2, where as the cross-coupled transistor pair 122 of the second oscillator 120 uses PMOS devices T3 and T3. Source terminals of the NMOS devices T1 and T2 are coupled to ground potential and source terminals of the PMOS devices T3 and T4 are coupled to a positive voltage supply VDD. The first and the second oscillators 110 and 120 are coupled through sharing a single inductor formed by a coupled inductor pair 140. The NMOS and PMOS devices used in the CMOS oscillator 100A can be thin oxide devices, which allow higher frequency operation of the CMOS oscillator.

The single differential-inductor oscillator 100B (hereinafter "oscillator 100B"), shown in FIG. 1B, includes a tank circuit 132, and the cross-coupled transistor pair 112 coupled to one another at nodes 125 and 135, and a capacitor C2 (e.g., a variable capacitor) coupled between the nodes 125 and 135 to modify the tank circuit as described herein. The oscillator 100B is a stand-atone version of the first oscillator 110, in which the tank circuit 132 is coupled to the supply voltage VDD, instead of being coupled to another oscillator (e.g., 120). The tank circuit 112 includes a single differential inductor having an inductance L and formed by the coupled inductor pair 140 (e.g., windings W1 and W2) with a coupling coefficient k and L. The resistances R1 and R2 represent losses associated with the windings W1 and W2. In one or more implementations, the coupled inductor pair 140 can be realized as a spiral inductor having an inner loop that is smatter than an outer loop. The tank circuit 132 further includes capacitors C1 coupled in parallel with the coupled inductor pair 140.

The cross coupled transistor pair 112 includes a pair of transistors (e.g., MOS transistors, such as NMOS transistors) T1 and T2. A gate node of the transistor T1 is coupled to a drain node of the transistor T2, and a gate node of the transistor T2 is coupled to a drain node of the transistor T1. The source node of the both transistors T1 and T2 are coupled to ground potential and the drain nodes of the transistors T1 and T2 are coupled to nodes 125 and 135, respectively. The cross-coupled pair function as the active portion of the oscillator 100B that provides a negative resistance, which nullifies the damping effect of the positive resistances R1 and R2 associated with the windings W1 and W2 on the oscillation of the tank circuit 132. In one or more implementations, the source nodes of the transistors T1 and T2 may be coupled, instead of the ground potential, to a filtered current source to achieve a level of control of the output amplitude of the oscillator 100B. The configuration shown in FIG. 1B, however, can maximize the output amplitude and a figure of merit (FOM) described herein.

The operation of the oscillator 100B without the capacitor C2 is known, and the capacitor C2 is added as a modification feature to facilitate achieving a desired relationship between the differential and CM resonance frequencies of the oscillator circuit 100B. In one or more aspects, the capacitor C2 may be formed by a number of capacitor elements, the capacitances of which can be adjusted to tune the CM resonance frequency to be at twice the differential resonance frequency, as discussed in more detail herein. As an advantageous feature of the disclosed technique, the CM resonance frequency may be tuned independently of the differential resonance frequency, as shown in FIGS. 1C and 1D and described below.

Figure 1B:
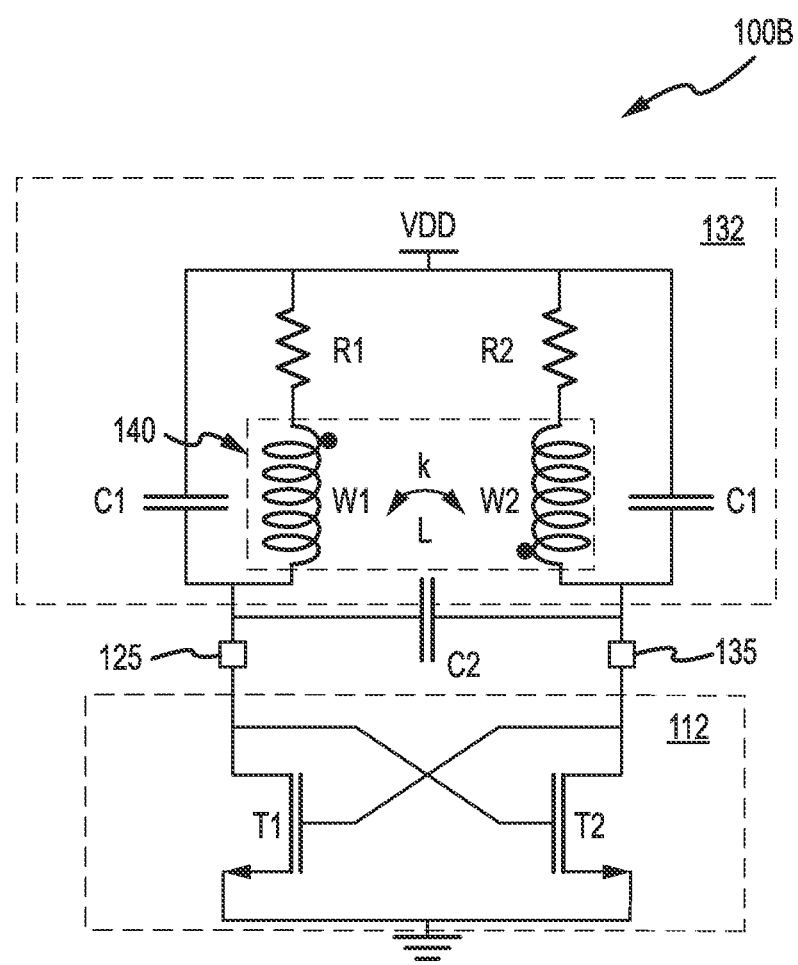
Figure 1C:
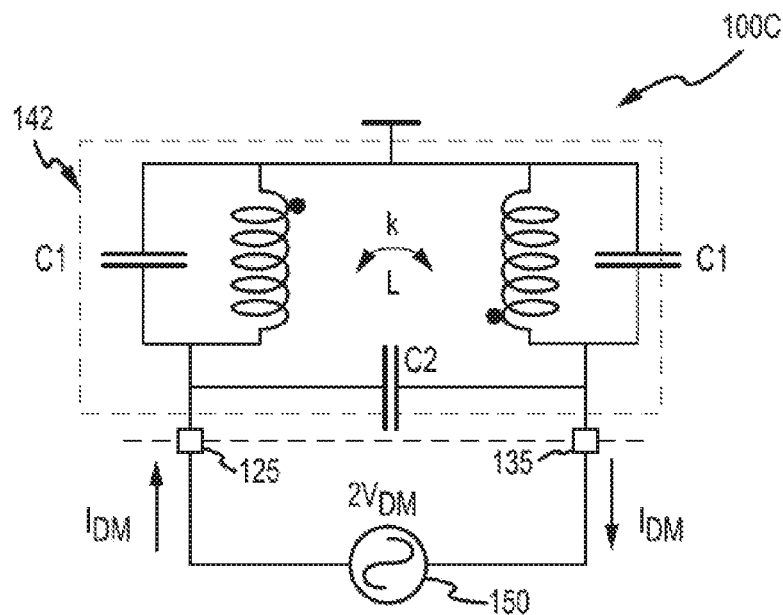
Figure 1D:
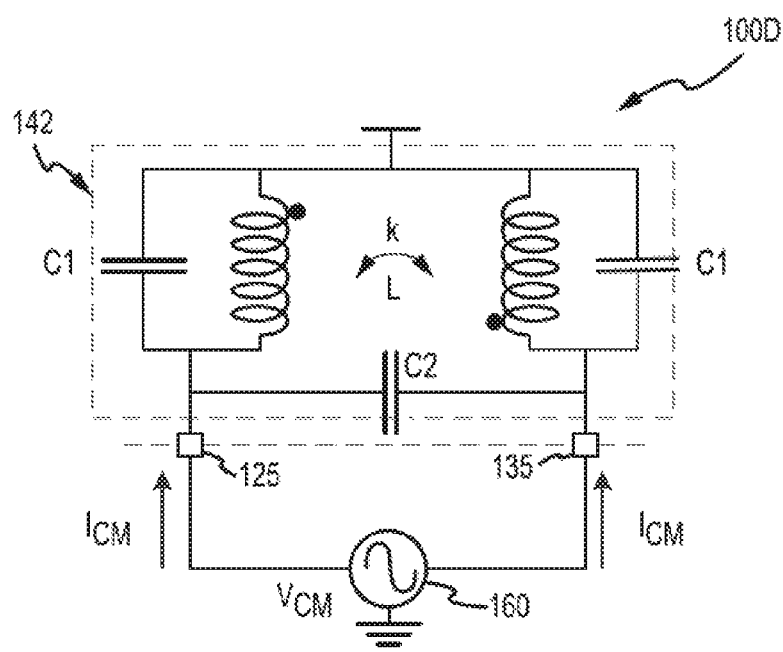

In the differential excitation equivalent circuit 100C shown in FIG. 1C, the tank circuit 142 is similar to the tank circuit 132 of FIG. 1B as modified by the capacitor C2 and is coupled at nodes 125 and 135 to a differential voltage signal source 150. In the tank circuit 142, the resistors R1 and R2 of tank circuit 132 are not shown as they are supposed to be canceled out by the negative resistance introduced by the cross-coupled transistor pair 112 of FIG. 1B. The cross-coupled transistor pair 112 is replaced by an equivalent differential voltage (e.g., $2V_{DM}$) signal source 150 that drives differential currents $I_{DM}$ to the tank circuit 142. From the differential excitation equivalent circuit 100C, the differential resonance frequency ($F_D$) can be derived as:

$$F_D = 1/(2\pi\sqrt{L(1+k)(C_{CM}+C_{DM})}) \quad (1)$$

Where, $F_D$ is the same as the oscillation frequency of the single differential-inductor oscillator, L and k are the inductance and coupling coefficient of the single inductor (e.g., the coupled pair of inductors 140) of FIG. 1B, and the differential mode capacitance $C_{DM}$ is equal to 2×C2 and $C_{CM}$ is equal to C1.

In the CM excitation equivalent circuit 100D shown in FIG. 1D, the tank circuit 142 is the same as the tank circuit 132 of FIG. 1B. The cross-coupled transistor pair 112 of FIG. 1B, in the CM excitation equivalent circuit 100D, is replaced by an equivalent CM voltage (e.g., $V_{CM}$) signal source 160 that drives CM currents $I_{CM}$ to the tank circuit 142. From the CM excitation equivalent circuit 100D, the CM resonance frequency can be derived as:

$$F_{CM} = 1/(2\pi\sqrt{L(1-k)C_{CM}}) \quad (2)$$

Where, $F_{CM}$ denotes the CM resonance frequency, L and k are the inductance and coupling coefficient of the single differential inductor of FIG. 1D, and the CM mode capacitance $C_{CM}$ is equal to C1. By proper selection of parameters k, C1 and C2, the CM resonance frequency can be tuned to be at twice the $F_D$ ($F_{CM}=2F_D$). It is known that meeting this condition can optimize the phase noise of the single differential-inductor oscillator 100B. The previous solutions achieve this condition by using an additional tank circuit. Elimination of the need for the additional tank circuit saves significantly on chip area and cost while achieving a substantially similar noise factor.

FIGS. 2A through 2D illustrate examples of plots of performance characteristics of the differential inductor oscillator of FIG. 1B and the CMOS oscillator with CM resonance of FIG. 1A in accordance with one or more implementations of the subject technology. The single differential-inductor oscillator 200 (hereinafter "oscillator 200") is the same as the oscillator 100B of FIG. 1B, except for the resistors R1 and R2 that are replaced with a resistor R. The tuning of the CM resonance frequency, as discussed above, may be performed by varying any of the parameters of the expressions (1) and (2) for the $F_D$ and $F_{CM}$, such as k, $C_{DM}$, and $C_{CM}$, where $C_{DM}$ and $C_{CM}$ are related to the capacitance values C1 and C2. In one or more embodiments, the values of the capacitances $C_{DM}$ and $C_{CM}$ may be expressed in terms of a variable X, for example, as $C_{DM}=XCp$ and $C_{CM}=(1-X)Cp$, where X can be varied to tune the CM resonance, and Cp is a constant capacitance value. The plot 210 illustrates variation of an FOM of the oscillator 200 in dBc/Hz versus the variable X for various values of a frequency offset Δω (e.g., 50 KHz, 300 KHz, and 3 MHz) from the oscillation frequency of the oscillator 200. The FOM may be characterized as the phase noise per unit power consumption of the oscillator, and can be more precisely defined as:

$$FOM = \frac{\left(\frac{\omega}{\Delta\omega}\right)^2}{L\{\Delta\omega\}P_{DC[mW]}} = \frac{2\eta Q^2}{kTF}10^{-3} \quad (3)$$

Where ω and $P_{DC}$ are the oscillation frequency and the total power consumption of the oscillator 200, respectively, η is the oscillator's power efficiency and Q quality factor of the tank circuit (e.g., 112 of FIG. 1B), and F is the noise factor. In other words, the FOM of the oscillator depends on three variables: quality factor Q, efficiency η, and noise factor F of the oscillator 200. The FOM of the oscillator is maximum at X~0.7, as shown, for curves 212, 214, and 216 corresponding to various values of the frequency offset Δω (e.g., 50 KHz, 300 KHz, and 3 MHz).

Curves 222, 224 and 226 of the plot 220 show the noise factor (F) versus the variable X for various values of a frequency offset Δω (e.g., 50 KHz, 300 KHz, and 3 MHz), and indicate that the noise factor is minimum at the same value of X~0.7 (this optimum value of X depends on k, and can vary between designs). In addition, the value of the minimum noise factor at X~0.7 is approximately equal to the theoretical minimum value (e.g., of 1.67). The plot 230 that shows the variation of efficiency η versus the variable X, in which a curve 232 passes through a maximum point, not far from the theoretical maximum value of 100% (e.g. approximately 80%), at an X value near 0.7. In other words, X=0.7 value can be used as an example value of X that can achieve the criterion of $F_{CM}=2F_D$ for optimizing the phase noise of the oscillator 200, as discussed above. In other embodiments, for different values of Cp, k, and L, other values of the variable X may achieve the criterion of $F_{CM}=2F_D$ for optimizing the phase noise of the oscillator.

Figure 2A:
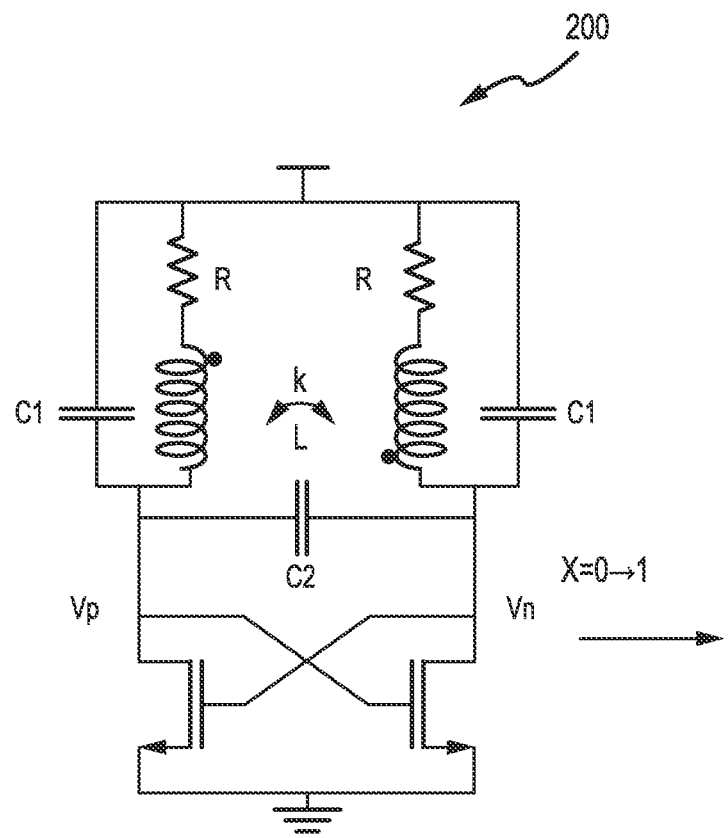
FIGS. 2A through 2D illustrate examples of plots of performance characteristics of the differential inductor oscillator of FIG. 1B and the CMOS oscillator with CM resonance of FIG. 1A in accordance with one or more implementations.
Figure 2B:
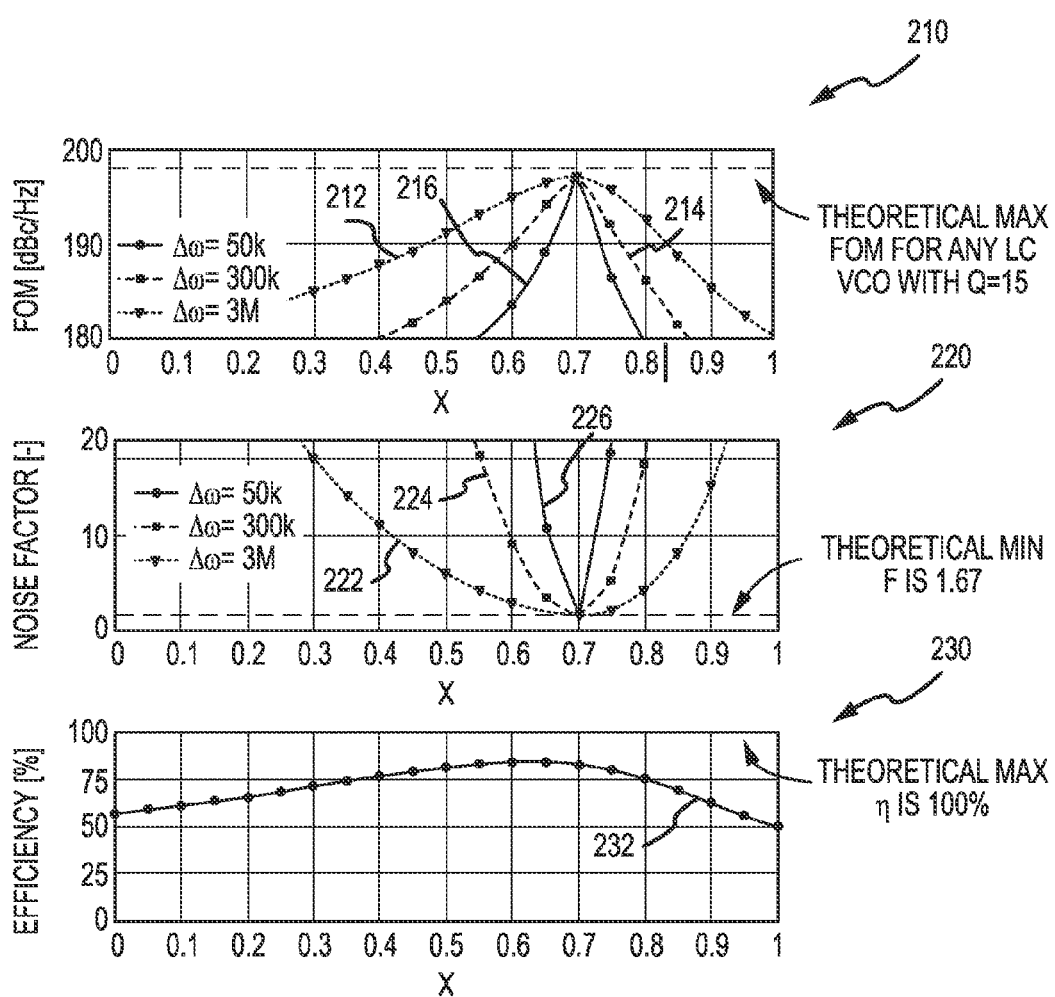
Figure 2C:
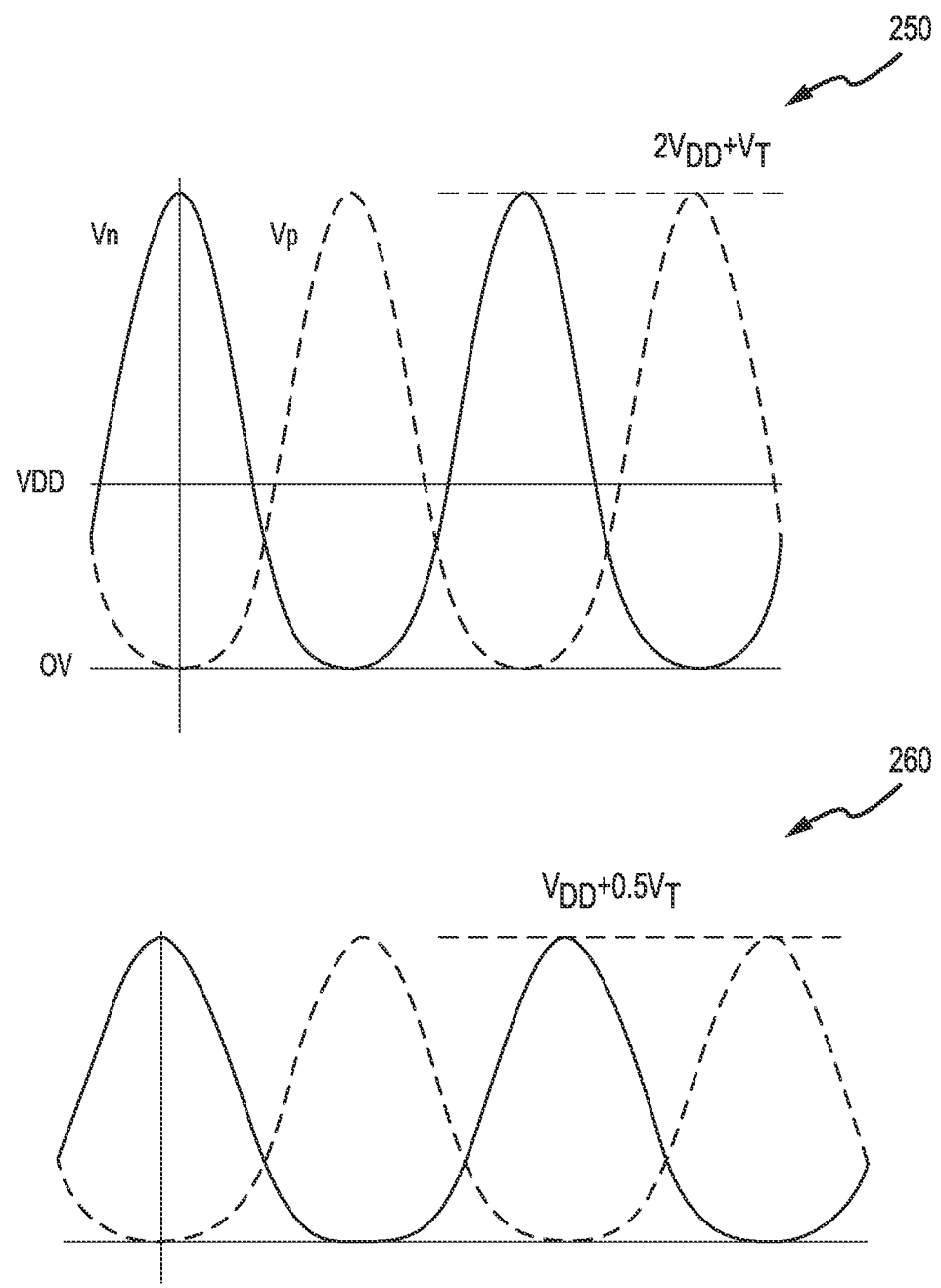
Figure 2D:
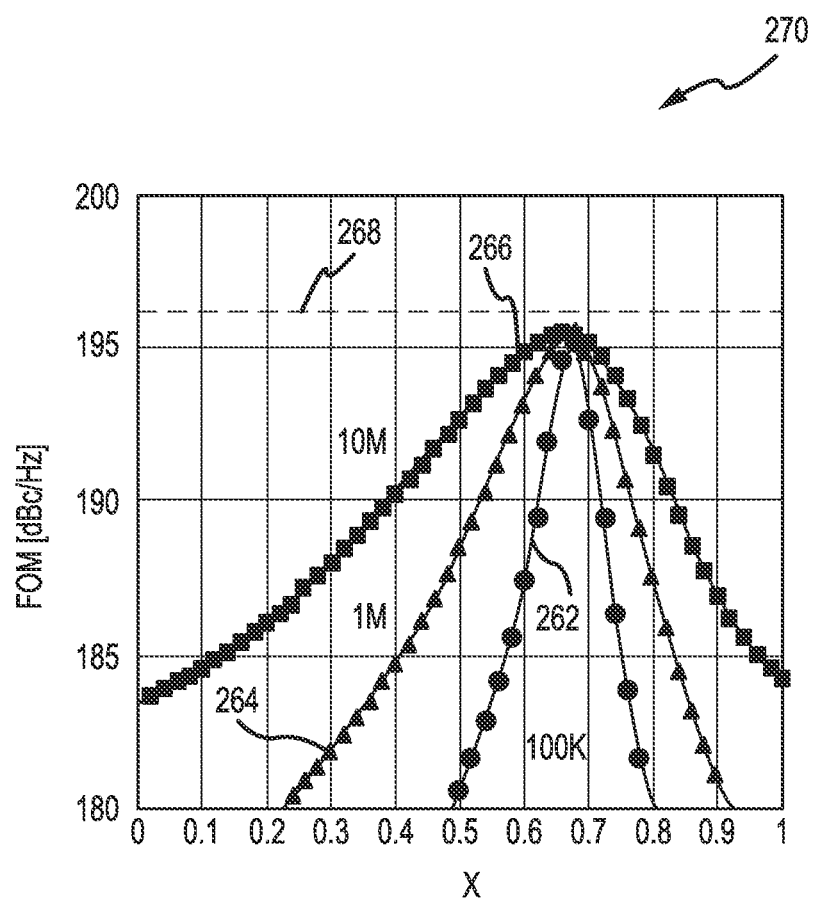

The single differential-inductor oscillator 200, as explained above, can achieve the desirable FOM and noise factor, but has to be implemented with thick oxide devices. This is because the thin oxide devices cannot operate properly above the VDD. As shown by the voltage plot 250 of FIG. 2C, the output voltage swing of the single differential-inductor oscillator 200 at nodes Vn and Vp exceeds 2VDD, which clearly is not appropriate for thin oxide device implementations. The CMOS oscillator (e.g., 100A of FIG. 1A) of the subject technology improves upon the single differential-inductor oscillator 200 to allow implementation with thin oxide. For the CMOS oscillator 100A, it can be shown that the output voltage swing, as illustrated by the voltage plot 260 of FIG. 2C, is half of the output voltage swing of the single differential-inductor oscillator 200. This allows the use of thin oxide devices in the disclosed CMOS oscillator, which permits higher frequency operation of the CMOS oscillator and saves on chip area as the devices can be made smaller with thin oxide devices.

The phase noise behavior of the CMOS oscillator 100A is shown in the plot 270 that illustrates variation of an FOM of the CMOS oscillator 100A in dBc/Hz versus the variable X for various values of a frequency offset Δω from the oscillation frequency of the CMOS oscillator 100A. The maximum FOM of the disclosed CMOS oscillator is seen to be within 1 dB of the maximum theoretical FOM 268. The FOM of the CMOS oscillator is maximum at X~0.7, as shown, for curves 262, 264, and 266 corresponding to various values of the frequency offset Δω (e.g., 100 KHz, 1 MHz, and 100 MHz).

FIGS. 3A-3C illustrate examples of implementation of differential and CM capacitors of an oscillator 300 with CM resonance in accordance with one or more implementations of the subject technology. The oscillator 300 is a wideband, practical realization of the topology shown in FIG. 2A. In the oscillator 300, the capacitor C2 of FIG. 2A (e.g., twice the differential capacitance $C_{DM}$) and the capacitor C1 of FIG. 2A (e.g., the CM capacitance $C_{CM}$) are replaced with a differential switch capacitance circuit 310 (e.g., a switch capacitor bank) and a CM capacitance tuning circuit 320 (e.g., a switch capacitor bank) coupled between nodes Vn and Vp of the oscillator 300. Capacitors C3 and C4 are fine tuning capacitances and the node 305 may be coupled to a VCO control voltage (Vc) that can be used to tune the oscillating frequency of the oscillator 300. The differential switch capacitance circuit 310 may be implemented using a number of differential switch capacitance unit cells 310-j (e.g., j can be between one and 32), as shown in FIG. 39. The CM capacitance tuning circuit 320 may include multiple CM capacitance tuning unit cells 320-j, as shown in FIG. 3C.

The ratio of the capacitances $C_{DM}$ and $C_{CM}$ may be set by the coupling coefficient k of the inductor L, through the expression:

$$\frac{C_{DM}}{C_{CM}} = \frac{3-5k}{1+k} \quad (4)$$

Where a higher k value may require less differential capacitance $C_{DM}$, but may result in a reduced common-mode quality factor Q. For example, if k=0.6, only common-mode capacitance $C_{CM}$ may be required, but the common-mode quality factor Q of the inductor L may be at least four times smaller than the differential quality factor Q of the same inductor L. By contrast, choosing a low or negative k value may maintain a large common-mode quality factor Q, but may require a small amount of common-mode capacitance, which may be difficult to achieve in a practical design. In one or more implementations, an inductor L with k=0.2 can be used that may require $C_{DM}/C_{CM}=1.67$, which may be implemented by using, for example, a two-turn inductor. To keep the coupling coefficient k small, the radius of the inner turn may be reduced.

Returning to FIG. 3B, the differential switch capacitance unit cells 310-j may include capacitors C11 and C12 (e.g., with fixed capacitances), a switch S1 (e.g., an NMOS transistor), bias inverters 312-j and 314-j, and resistors Rb1 and Rb2. The bias inverters 312-j and 314-j can selectively bias the switch S1 of a differential switch capacitance unit cell by coupling nodes of the switch S to high impedance supply terminals VDZ (e.g., tied to a normal analog supply voltage VDD) and VSZ (e.g., tied to ground potential). The selections may be made through control signals SW and $\overline{SW}$. Unlike a typical differential switched capacitor bank, all switch S1 may be placed in a common deep n-well, where the isolated p-substrate and surrounding n-well may be tied to ground and VDD, respectively, using large resistors Rb1 and Rb2. The use of the high impedance supply terminals VDZ and VSZ may facilitate minimizing the common-mode capacitance of the switch S1 due to the bulk diodes and gate capacitance, which can be significant when the switch is in the OFF state. In some embodiments, the size of the resistors Rb1 and Rb2 can be chosen such that they are large enough to prevent the common-mode quality factor Q from being degraded, but sufficiently small to prevent these resistors from significantly contributing to the phase noise through frequency modulation effects. In some aspects, the resistors Rb1 and Rb2 may have the same resistance values.

The CM capacitance tuning unit cells 320-j includes capacitors C21 and C22, and a switch S2 (e.g., a an NMOS transistor) controlled by control signals SW and $\overline{SW}$, applied through inverters and a bias resistor Rb. When the switch S2 is turned OFF, the capacitors C21 and C22 appear differentially across the VCO tank (between nodes Vn and Vp), but when the switch S2 is turned ON, the capacitors C21 and C22 are shunted to the ground potential.

Returning to FIG. 1A, the differential and CM capacitors of the CMOS oscillator 100A of FIG. 1A can be similarly implemented as explained above with respect to the Oscillator 300.

Figure 4:
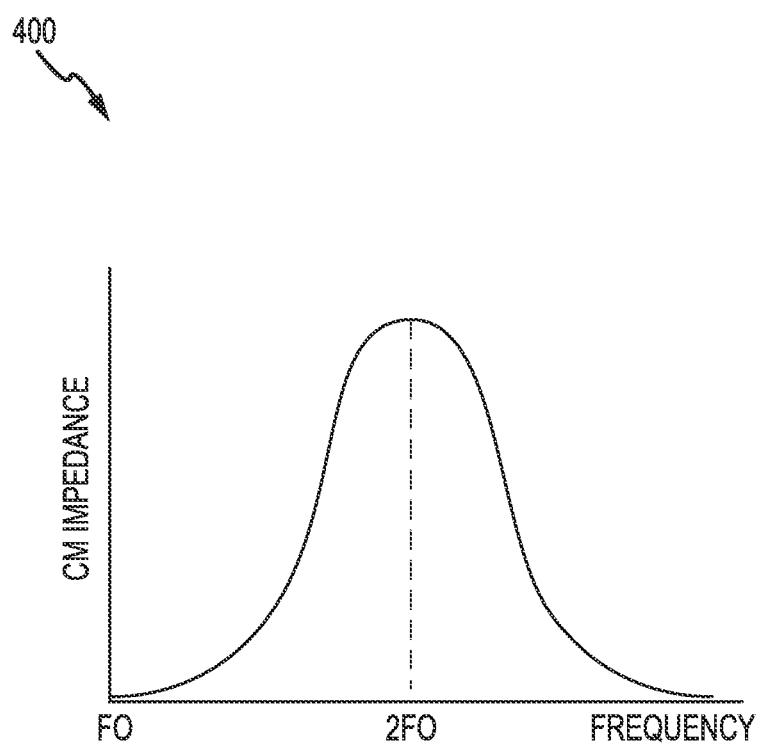
FIG. 4 illustrates an example of a plot of CM impedance versus frequency for a single differential-inductor oscillator with CM resonance in accordance with one or more implementations.

FIG. 4 illustrates an example of a plot 400 of the CM impedance versus frequency for an oscillator 300 of FIG. 3A in accordance with one or more implementations of the subject technology. The plot 400 shows that the CM impedance of the disclosed oscillator 300 is maximum at a frequency equal to twice the resonance frequency of the oscillator e.g., FO). This is an advantageous feature of the subject technology over the existing solution that can achieve similar objectives without using an additional tank circuit.

Figure 5:
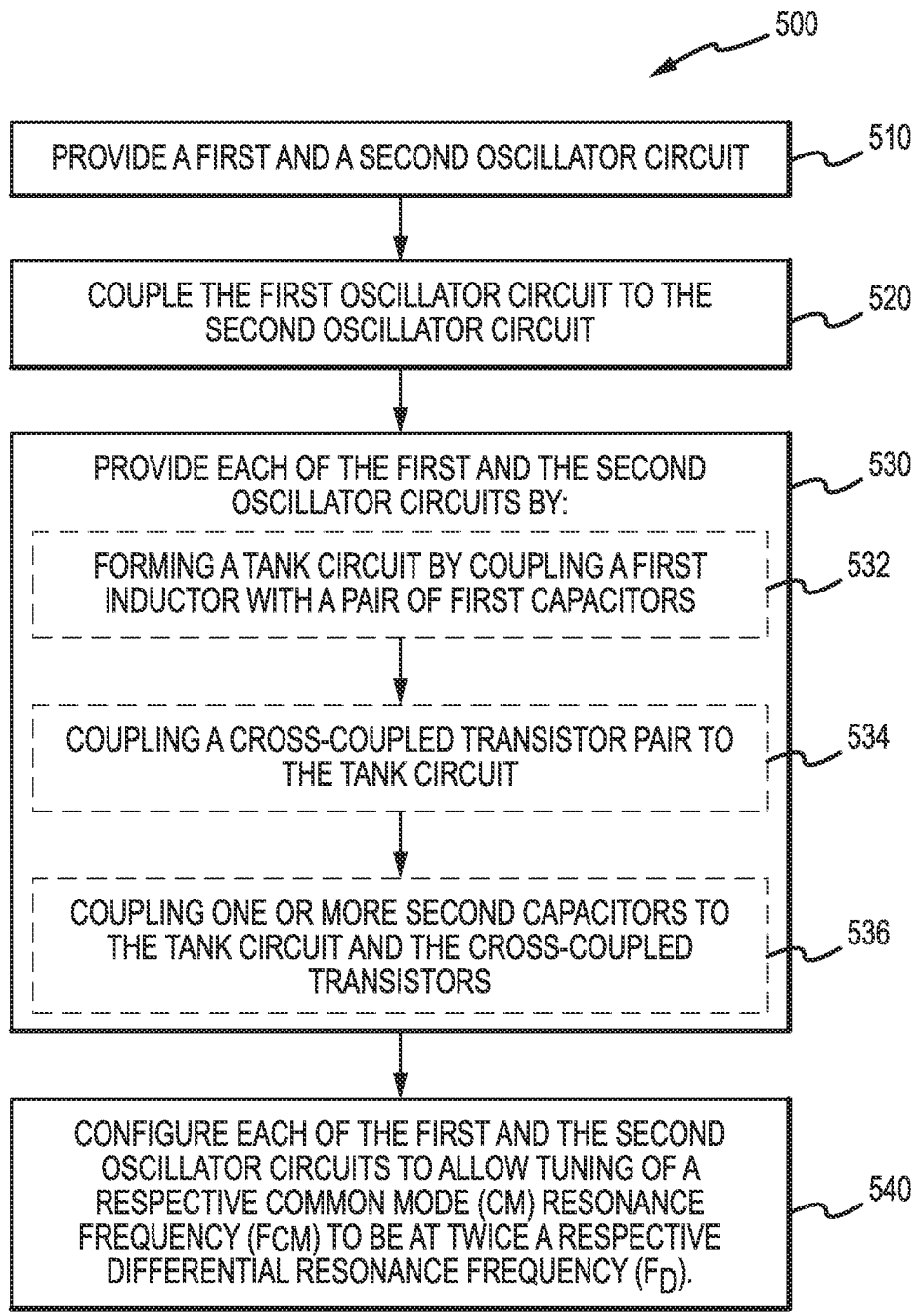
FIG. 5 illustrates an example of a method of providing an oscillator with common-mode resonance in accordance with one or more implementations.

FIG. 5 illustrates an example of a method 500 of providing an oscillator with common-mode resonance in accordance with one or more implementations of the subject technology. The method 500 may include providing a first and a second oscillator (e.g., 110 and 120 of FIG. 1A) (510). Coupling the first oscillator to the second oscillator (520). Providing each of the first and second oscillators (530) by: forming a tank circuit (e.g., 132 of FIG. 1B) by coupling a first inductor (e.g., L of FIG. 1B) with a pair of first capacitors (e.g., C1 of FIG. 1B) (532); coupling across-coupled transistor pair (e.g., 120 of FIG. 1B) to the tank circuit (534); and coupling one or more second capacitors (e.g., C2 of FIG. 1B) to the tank circuit and the cross-coupled transistors (536). Each of the first and the second oscillator is configured to allow tuning (e.g., by using 310 and 320 of FIG. 3A) of a respective common mode (CM) resonance frequency ($F_{CM}$) to be at twice a respective differential resonance frequency ($F_D$) (540).

Figure 6:
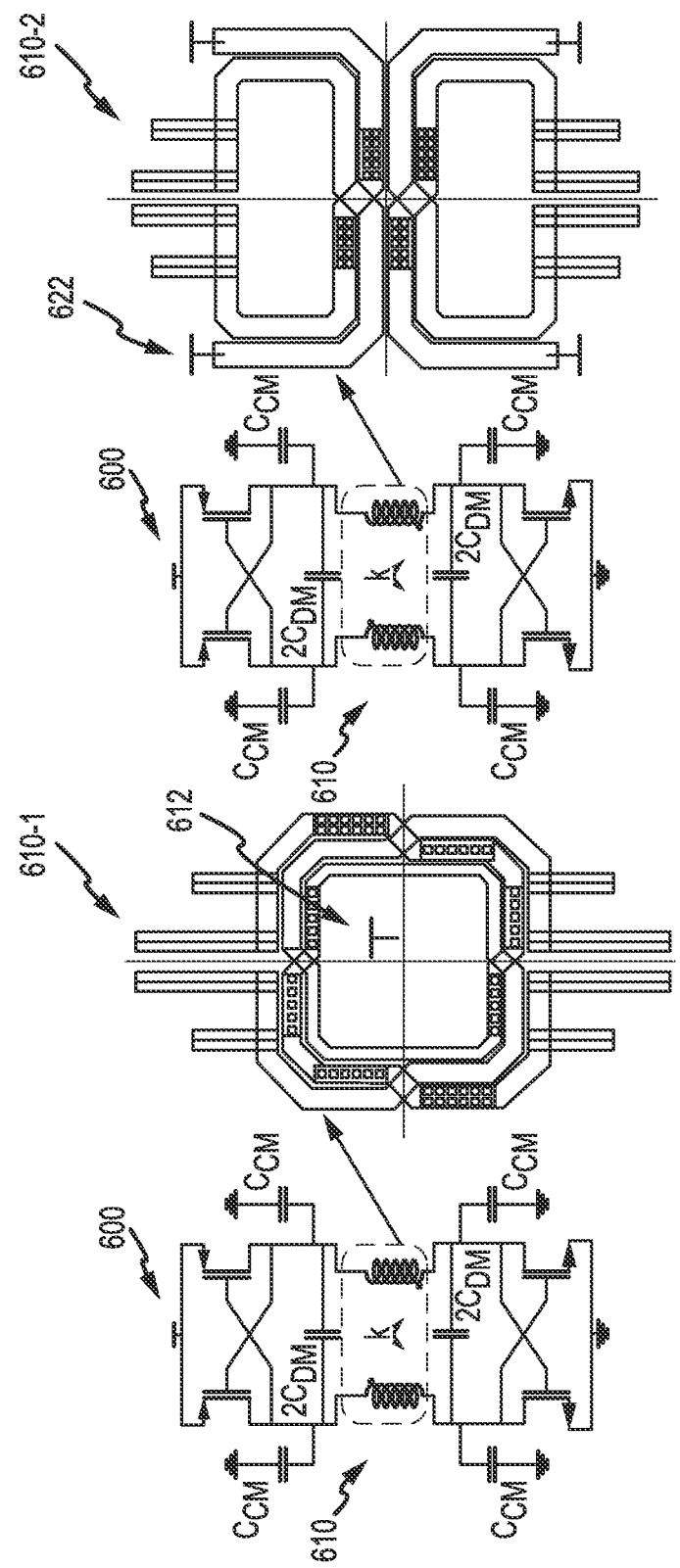
FIG. 6 illustrates die micrographs depicting examples of implementation of coupled inductors of a tank circuit in accordance with one or more implementations.

FIG. 6A illustrates die micrographs depicting examples of implementation of coupled inductors of a tank circuit in accordance with one or more implementations of the subject technology. The CMOS oscillator 100A of FIG. 1A is formed, as explained above by coupling two single-inductor oscillators (e.g., 100B of FIG. 1B). The resulting CMOS oscillator includes only one coupled pair of inductors (e.g., transformers) 610 as shown in FIG. 6A, which significantly reduces chip area. An implementation by the die 610-1 of the transformer 610 can provide a strong coupling (e.g., larger k), between windings of the transformer 610. An implementation by the die 610-2 of the transformer 610 can provide a light coupling between the windings of the transformer 610. The node 612 of the die 610-1 is virtual ground that can be floating. The nodes 622 of the die 610-2 are virtual grounds and can be coupled through large capacitances to ground potential.

Figure 7:
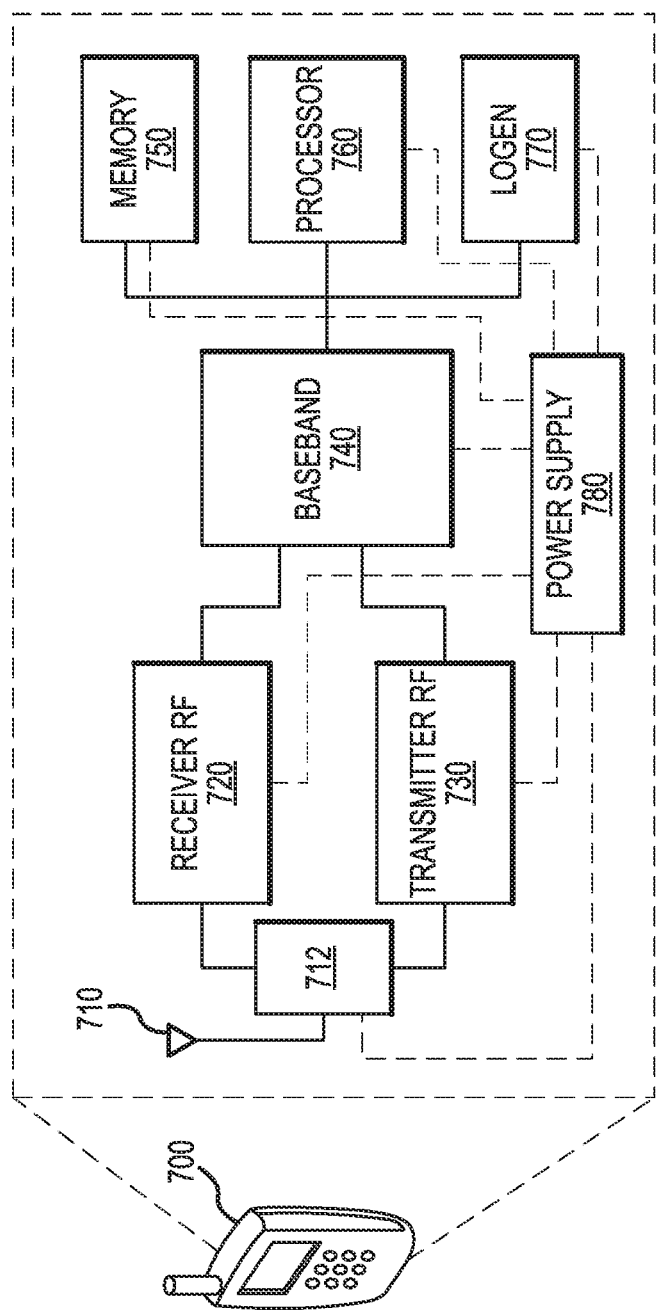
FIG. 7 illustrates an example wireless communication device in accordance with one or more implementations.

FIG. 7 illustrates an example wireless communication device 700 in accordance with one or more implementations of the subject technology. The wireless communication device 700 may comprise a radio-frequency (RF) antenna 710, a receiver 720, a transmitter 730, a baseband processing module 740, a memory 750, a processor 760, a local oscillator generator (LOGEN) 770, and a power supply 780. In various embodiments of the subject technology, one or more of the blocks represented in FIG. 7 may be integrated on one or more semiconductor substrates. For example, the blocks 720-770 may be realized in a single chip or a single system on chip, or may be realized in a multi-chip chipset.

The RF antenna 710 may be suitable for transmitting and/or receiving RF signals (e.g., wireless signals) over a wide range of frequencies. Although a single RE antenna 710 is illustrated, the subject technology is not so limited.

The receiver 720 may comprise suitable logic circuitry and/or code that may be operable to receive and process signals from the RF antenna 710. The receiver 720 may, for example, be operable to amplify and/or down-covert received wireless signals. In various embodiments of the subject technology, the receiver 720 may be operable to cancel noise in received signals and may be linear over a wide range of frequencies. In this manner, the receiver 720 may be suitable for receiving signals in accordance with a variety of wireless standards, Wi-Fi, WiMAX, Bluetooth, and various cellular standards. In various embodiments of the subject technology, the receiver 720 may not require any SAW filters and few or no off-chip discrete components such as large capacitors and inductors.

The transmitter 730 may comprise suitable logic circuitry and/or code that may be operable to process and transmit signals from the RF antenna 710. The transmitter 730 may, for example, be operable to up-covert baseband signals to RF signals and amplify RF signals. In various embodiments of the subject technology, the transmitter 730 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 730 may be operable to provide signals for further amplification by one or more power amplifiers.

The duplexer 712 may provide isolation in the transmit band to avoid saturation of the receiver 720 or damaging parts of the receiver 720, and to relax one or more design requirements of the receiver 720. Furthermore, the duplexer 712 may attenuate the noise in the receive band. The duplexer may be operable in multiple frequency bands of various wireless standards.

The baseband processing module 740 may comprise suitable logic, circuitry, interfaces, and/or code that may be operable to perform processing of baseband signals. The baseband processing module 740 may, for example, analyze received signals and generate control and/or feedback signals for configuring various components of the wireless communication device 700 such as the receiver 720. The baseband processing module 740 may be operable to encode, decode, transcode, modulate, demodulate, encrypt, decrypt, scramble, descramble, and/or otherwise process data in accordance with one or more wireless standards.

The processor 760 may comprise suitable logic, circuitry, and/or code that may enable processing data and/or controlling operations of the wireless communication device 700. In this regard, the processor 760 may be enabled to provide control signals to various other portions of the wireless communication device 700. The processor 760 may also control transfers of data between various portions of the wireless communication device 700. Additionally, the processor 760 may enable implementation of an operating system or otherwise execute code to manage operations of the wireless communication device 700.

The memory 750 may comprise suitable logic, circuitry, and/or code that may enable storage of various types of information such as received data, generated data, code, and/or configuration information. The memory 750 may comprise, for example, RAM, ROM, flash, and/or magnetic storage. In various embodiment of the subject technology, information stored in the memory 750 may be utilized for configuring the receiver 720 and/or the baseband processing module 740.

The local oscillator generator (LOGEN) 770 may comprise suitable logic, circuitry, interfaces, and/or code that may be operable to generate one or more oscillating signals of one or more frequencies. The LOGEN 770 may be operable to generate digital and/or analog signals. In this manner, the LOGEN 770 may be operable to generate one or more clock signals and/or sinusoidal signals. Characteristics of the oscillating signals such as the frequency and duty cycle may be determined based on one or more control signals from, for example, the processor 760 and/or the baseband processing module 740. In one or more implementations, the LOGEN 770 may employ the high performance CMOS oscillator (e.g., a VCO) with CM resonance of the subject technology (e.g., 100A of FIG. 1A) to generate the one or more clock signals and/or sinusoidal signals. The high performance of the disclosed CMOS oscillator with CM resonance may be near the fundamental limit of LC CMOS VCO performance, limited only by quality factor Q of the tank circuit. An advantageous feature of the disclosed VCO is the implicit common-mode resonance at $2 \times F_{LO}$ that is accomplished without an additional inductor and the thin oxide implementation of the devices that allows higher frequency operation and smaller chip area.

In operation, the processor 760 may configure the various components of the wireless communication device 700 based on a wireless standard according to which it is desired to receive signals. Wireless signals may be received via the RF antenna 710 and amplified and down-converted by the receiver 720. The baseband processing module 740 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 750, and/or information affecting and/or enabling operation of the wireless communication device 700. The baseband processing module 740 may modulate, encode and perform other processing on audio, video, and/or control signals to be transmitted by the transmitter 730 in accordance to various wireless standards. The power supply 780 may provide one or more regulated rail voltages (e.g., $V_{DD}$) for various circuitries of the wireless communication device 700.

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa.

Headings and subheadings, if any, are used for convenience only and do not limit the subject disclosure.

What is claimed is:

1. A circuit for an oscillator with common-mode resonance, the circuit comprising:
a first oscillator circuit comprising a first cross-coupled transistor pair including a first transistor and a second transistor, a gate node of the first transistor directly connected to a drain node of the second transistor and a gate node of the second transistor directly connected to a drain node of the first transistor, wherein the first transistor and the second transistor are NMOS transistors; and
a second oscillator circuit comprising a second cross-coupled transistor pair including a third transistor and a fourth transistor, a gate node of the third transistor directly connected to a drain node of the fourth transistor and a gate node of the fourth transistor directly connected to a drain node of the third transistor, the second cross-coupled transistor pair being coupled to the first oscillator circuit via a joint tank circuit, wherein the third transistor and the fourth transistor are PMOS transistors,
wherein the joint tank circuit comprises:
a differential coupled pair of inductors including a first node, a second node, a third node, and a fourth node, the first node and the second node coupled with a pair of first capacitors to ground potential; and
a pair of second capacitors, one capacitor of the pair of second capacitors being coupled between the first node and the second node of the differential coupled pair of inductors that are respectively coupled to drain nodes of the first NMOS transistor and the second NMOS transistor of the first cross-coupled transistor pair, and another capacitor of the pair of second capacitors being coupled between the third node and the fourth node of the differential coupled pair of inductors that are respectively coupled to drain nodes of the third PMOS transistor and the fourth PMOS transistor of the second cross-coupled transistor pair, and
wherein each of the first oscillator circuit and the second oscillator circuit is configured to allow tuning of a respective common mode resonance frequency ($F_{CM}$) to be at twice a respective differential resonance frequency ($F_D$) by adjusting a ratio of capacitance values of the pair of the first and second capacitors.

2. The circuit of claim 1, wherein the first and the second oscillator circuits are similar except for transistor types of the first and second cross-coupled transistor pairs.

3. The circuit of claim 2, wherein:
each of the first and the second oscillator circuits comprises a voltage-controlled oscillator (VCO).

4. The circuit of claim 1, wherein the differential inductor comprises a coupled inductor pair that is realized as a spiral inductor having an inner loop that is smaller than an outer loop.

5. The circuit of claim 1, wherein the pair of first capacitors is realized by a differential switch capacitance circuit comprising a plurality of differential switch capacitance unit cells.

6. The circuit of claim 5, wherein at least some of the plurality of differential switch capacitance unit cells are realized by two capacitors and a variable capacitance associated with a deep N-well device, having inherent junction diodes, that is biased by using high impedance supplies.

7. The circuit of claim 1, wherein the pair of second capacitors are realized by a CM capacitance tuning circuit comprising a plurality of common mode (CM) capacitance tuning unit cells, and wherein at least some of the plurality of CM capacitance tuning unit cells are realized by two capacitors having a common node coupled through a switch to ground potential.

8. The circuit of claim 1, wherein at least one of the first oscillator circuit or the second oscillator circuit is configured to allow tuning of the respective $F_{CM}$ independent of the respective $F_D$, and wherein the at least one of the first oscillator circuit or the second oscillator circuit is configured to allow maximizing a value of a common mode (CM) impedance at the respective $F_{CM}$.

9. The circuit of claim 1, wherein the oscillator with common-mode resonance is configured to achieve a same phase noise performance as one of the first oscillator circuit or the second oscillator circuit, and wherein the first and second cross-coupled transistor pair comprises thin-oxide devices.

10. The circuit of claim 1, wherein at least one of the first oscillator circuit or the second oscillator circuit is configured to maximize values of phase noise per unit power for multiple frequency offsets at a point that corresponds to an optimum ratio of capacitance values of the first and second capacitors, wherein the multiple frequency offsets are measured from a resonance frequency of a differential-inductor oscillator, and wherein the optimum ratio of capacitance values of the pair of first and second capacitors corresponds to the respective $F_{CM}$ being twice the respective $F_D$.

11. A method for providing an oscillator with common-mode resonance, the method comprising:
providing a first oscillator circuit comprising a first cross-coupled transistor pair and a second oscillator circuit comprising a second cross-coupled transistor pair, wherein the first cross-coupled transistor pair includes a first transistor and a second transistor, a gate node of the first transistor directly connected to a drain node of the second transistor and a gate node of the second transistor directly connected to a drain node of the first transistor, wherein the first transistor and the second transistor are NMOS transistors, and wherein the second cross-coupled transistor pair includes a third transistor and a fourth transistor, a gate node of the third transistor directly connected to a drain node of the fourth transistor and a gate node of the fourth transistor directly connected to a drain node of the third transistor, wherein the third transistor and the fourth transistor are PMOS transistors; and
coupling the first oscillator circuit to the second oscillator circuit via a joint tank circuit,
wherein providing the joint tank circuit comprises:
providing a differential coupled pair of inductors including a first node, a second node, a third node, and a fourth node, the first node and the second node coupled with a pair of first capacitors to ground potential; and
coupling one capacitor of a pair of second capacitors between the first node and the second node of the differential coupled pair of inductors that are respectively coupled to drain nodes of the first NMOS transistor and the second NMOS transistor of the first cross-coupled transistor pair, and another capacitor of the pair of second capacitors being coupled between the third node and the fourth node of the differential coupled pair of inductors that are respectively coupled to drain nodes of the third PMOS transistor and the fourth PMOS transistor of the second cross-coupled transistor pair, and wherein each of the first oscillator circuit and the second oscillator circuit is configured to allow tuning of a respective common mode resonance frequency ($F_{CM}$) to be at twice a respective differential resonance frequency ($F_D$) by adjusting a ratio of capacitance values of the pair of the first and second capacitors.

12. The method of claim 11, wherein providing the first and the second oscillator circuits comprises providing similar circuitry except for transistor types of the first and second cross-coupled transistor pair.

13. The method of claim 12, wherein:

each of the first and the second oscillators comprise a voltage-controlled oscillator (VCO).

14. The method of claim 11, wherein the differential inductor comprises a coupled inductor pair that is realized as a spiral inductor having an inner loop that is smaller than an outer loop.

15. The method of claim 14, further comprising:

implementing the pair of first capacitors by a differential switch capacitance circuit comprising a plurality of differential switch capacitance unit cells; and implementing at least some of the plurality of differential switch capacitance unit cells by coupling two capacitors and a variable capacitance associated with a deep N-well device with inherent junction diodes, and biasing the deep N-well device by using high impedance supplies.

16. The method of claim 11, further comprising implementing the pair of second capacitors by a common mode (CM) capacitance tuning circuit comprising a plurality of CM capacitance tuning unit cells, and realizing at least some of the plurality of CM capacitance tuning unit cells by two capacitors having a common node coupled through a switch to ground potential.

17. The method of claim 11, further comprising:

configuring at least one of the first oscillator circuit or the second oscillator circuit to allow tuning of the respective $F_{CM}$ independent of the respective $F_D$; and configuring the at least one of the first oscillator circuit or the second oscillator circuit to maximize a value of a common mode (CM) impedance at the respective $F_{CM}$.

18. The method of claim 11, further comprising configuring at least one of the first oscillator circuit or the second oscillator circuit to maximize values of phase noise per unit power for multiple frequency offsets at a point that corresponds to an optimum ratio of capacitance values of the pair of the first and second capacitors, wherein the multiple frequency offsets are measured from a resonance frequency of the at least one of the first oscillator circuit or the second oscillator circuit, and wherein the optimum ratio of capacitance values of the pair of the first and second capacitors corresponds to the respective $F_{CM}$ being twice that of the respective $F_D$.

19. The method of claim 11, further comprising:

configuring an oscillator with common-mode resonance to achieve a same phase noise performance as one of the first oscillator circuit or the second oscillator circuit;

and implementing the first and second cross-coupled transistor pairs using thin-oxide devices.

20. A communication device comprising:

a radio-frequency (RF) transceiver comprising one or more local oscillators, the one or more local oscillators comprising at least one oscillator with common-mode resonance, wherein the at least one oscillator with common-mode resonance comprises:

a first oscillator circuit comprising a first cross-coupled transistor pair including a first transistor and a second transistor, a gate node of the first transistor directly connected to a drain node of the second transistor and a gate node of the second transistor directly connected to a drain node of the first transistor, wherein the first transistor and the second transistor are NMOS transistors; and a second oscillator circuit comprising a second cross-coupled transistor pair including a third transistor and a fourth transistor, a gate node of the third transistor directly connected to a drain node of the fourth transistor and a gate node of the fourth transistor directly connected to a drain node of the third transistor, the second cross-coupled transistor pair being coupled to the first oscillator circuit via a joint tank circuit, wherein the third transistor and the fourth transistor are PMOS transistors, wherein the joint tank circuit comprises:

a differential coupled pair of inductors including a first node, a second node, a third node, and a fourth node, the first node and the second node coupled with a pair of first capacitors to ground potential; and a pair of second capacitors, one capacitor of the pair of second capacitors being coupled between the first node and the second node of the differential coupled pair of inductors that are respectively coupled to drain nodes of the first NMOS transistor and the second NMOS transistor of the first cross-coupled transistor pair, and another capacitor of the pair of second capacitors being coupled between the third node and the fourth node of the differential coupled pair of inductors that are respectively coupled to drain nodes of the third PMOS transistor and the fourth PMOS transistor of the second cross-coupled transistor pair, and wherein each of the first oscillator circuit and the second oscillator circuit is configured to allow tuning of a respective common mode resonance frequency ($F_{CM}$) to be at twice a respective differential resonance frequency ($F_D$) by adjusting a ratio of capacitance values of the pair of the first and second capacitors.

* * * * *